(12) United States Patent
Smidt et al.

(10) Patent No.: US 7,015,754 B2
(45) Date of Patent: Mar. 21, 2006

(54) ISOLATED CONVERTER WITH SYNCHRONIZED SWITCHING LEG

(75) Inventors: Pieter Jan Mark Smidt, Eindhoven (NL); Jorge Luiz Duarte, Maastricht (NL); Rudi Jonkman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/498,641

(22) PCT Filed: Nov. 20, 2002

(86) PCT No.: PCT/IB02/04981

§ 371 (c)(1),
(2), (4) Date: Jun. 14, 2004

(87) PCT Pub. No.: WO03/052912

PCT Pub. Date: Jun. 26, 2003

(65) Prior Publication Data

US 2005/0017805 A1    Jan. 27, 2005

(30) Foreign Application Priority Data

Dec. 17, 2001  (EP)  ............................ 01204931

(51) Int. Cl.
  *H03F 3/217*  (2006.01)

(52) U.S. Cl. .................................. 330/251; 330/207 A
(58) Field of Classification Search ................ 330/251, 330/207 A, 63, 72, 146, 154, 165, 276
See application file for complete search history.

(56) References Cited

U.S. PATENT DOCUMENTS

| 4,066,974 A | * | 1/1978 | Reinhard | ...................... 330/10 |
| 5,396,194 A | * | 3/1995 | Williamson et al. | ........ 330/297 |
| 6,252,784 B1 | * | 6/2001 | Dobrenko | ................ 363/21.12 |

FOREIGN PATENT DOCUMENTS

| DE | 3447566 | 7/1986 |
| EP | 0651501 | 5/1995 |

* cited by examiner

*Primary Examiner*—Henry Choe

(57) ABSTRACT

An amplification device is disclosed providing a way of integrating a switch mode power supply and a class D amplifier (switch mode amplifier). This results in the usage of basically one magnetic component (1), one major energy storage element (4) and switches (20, 30) that are controlled in such a way that both the power supply function and the amplification function are achieved. In this way a cheap, small and highly efficient current configuration is achieved. This amplification device is especially useful in audio products.

20 Claims, 2 Drawing Sheets

ISOLATED CONVERTER WITH SYNCHRONIZED SWITCHING LEG

Figure 1:
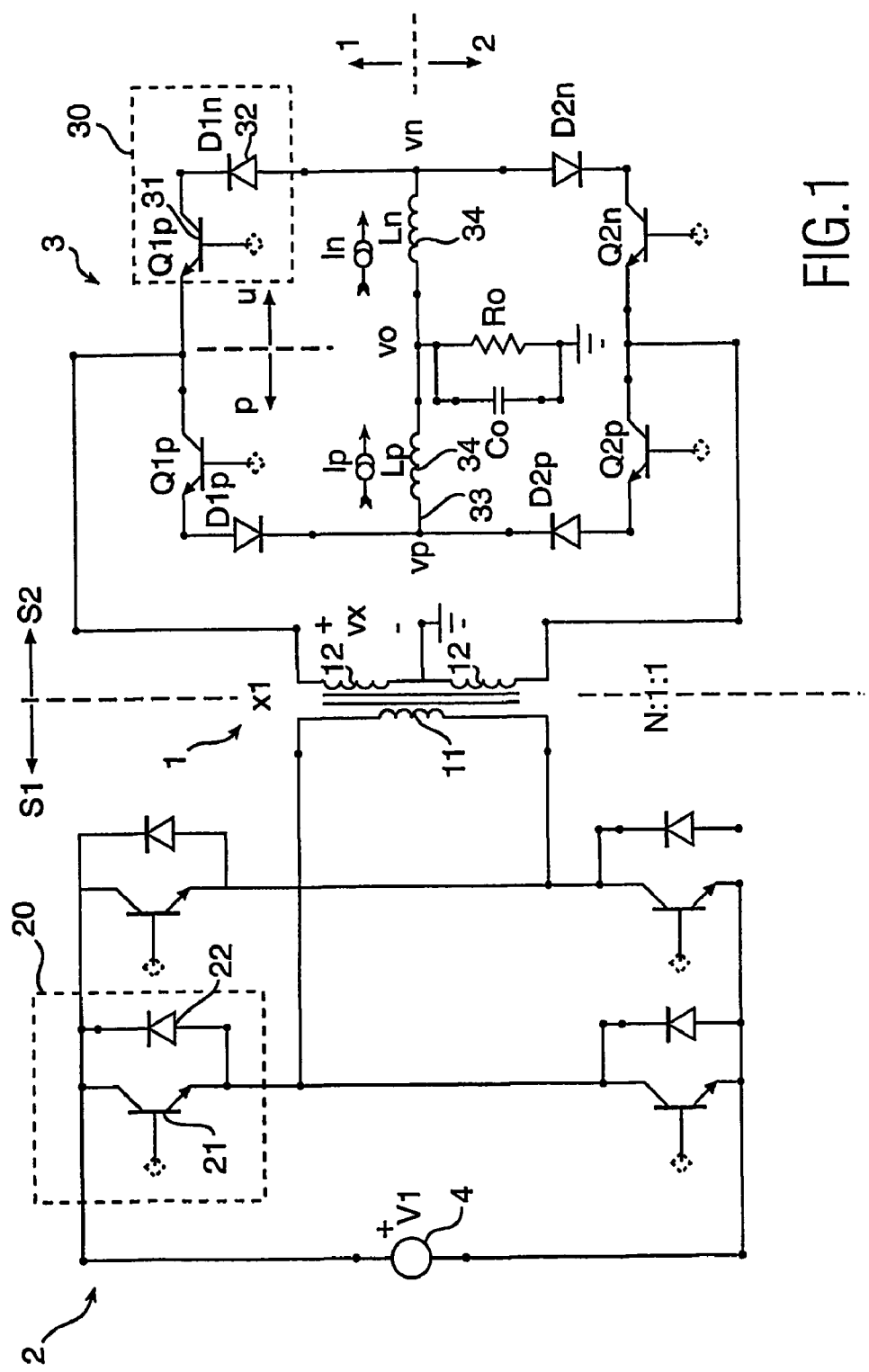

The present invention relates to an amplification device comprising a switch mode power supply part and a switch mode amplifier part.

At present by far the most amplifier configurations consist of a class AB amplifier that is supplied by a linear (copper-iron based) power supply that also provides the mains isolation. However, drawbacks of this configuration are the high weight, large size and very poor efficiency. With ever narrowing requirements regarding efficiency and stand-by power as well as miniaturization requirements, this kind of setup becomes more and more a bottleneck. Various attempts have been made to improve the efficiency of this setup. Mainly those attempts tried to improve the efficiency of the linear power supply by replacing it with a switch mode power supply, or by replacing the class AB amplifier by a so called class D (=switch mode) amplifier. Such solutions are e.g. disclosed in DE 34 47 566 and EP 0 561 501. However, the switch mode power supply as well as the class D amplifier both need several costly components, such as switches, magnetic components, energy storage elements, control units etc. Accordingly, because of e.g. cost reasons these kinds of solutions have not been successful in the consumer electronics market.

Class-D amplifier topology makes use of a pulse-width modulation scheme. Class D operation is switching, and therefore class-D amplifiers are also referred to as switching power amplifiers. In this type of amplifier, the output is rapidly switched on and off, and preferably at least twice for each sampling period. In this manner, the dissipated power could be essentially eliminated.

The term switch mode converter is conventionally used in the art to describe a circuit which takes a DC or AC input and provides a single or multiple DC or AC output, of the same or opposite polarity and lower or higher voltage.

Therefore there is a need for a device comprising a class-D amplifier and an SMPS which is less costly or more efficient, and hence alleviates the problems experienced in the prior art.

It is therefore an object of the present invention to provide an amplification device comprising a switch mode power supply part and a switch mode amplifier part which is more effective and/or less costly.

This object is achieved by means of an amplification device according to the invention, as defined in the appended claims.

The invention relates to an amplification device comprising a switch mode power supply part and a switch mode amplifier part, characterized in that it comprises:

a magnetic component forming a primary and secondary side of the device, said primary side being coupled to a voltage input of the device and said secondary side being coupled to a voltage output of the device, said magnetic component being operative for both the switch mode power supply part and the switch mode amplifier part; and at least one control unit on each side of the magnetic component for controlling the current and/or the voltage.

This amplification device provides a combination of a switch mode power supply and a class D amplifier, wherein at least some vital and costly parts are shared by the different parts. In this way an efficient and less costly device is provided than in the conventional solution where the parts are essentially totally separated. According to the invention, a magnetic component, preferably a transformer, is shared by the parts. By virtue thereof, essentially only one major magnetic component is required. In this way a cheap, small, highly efficient, and commercially viable replacement for the current configuration could be achieved.

Preferably, the switch mode power supply part and the switch mode amplifier part form an integrated unit, so that an even smaller device is provided.

It is further preferred that at least one energy storage element is arranged on the primary side, which energy storage element is operative for both the switch mode power supply part and the switch mode amplifier part. As a result, another important component is shared by the functional parts of the device, rendering it more efficient and less costly.

Preferably, the power supply function and the amplification function are provided by controlling the control unit in such a way that said functions are achieved. As a result, a relatively simple and inexpensive design becomes possible.

Most efficiently, this could be achieved by using control units on the primary side comprising switches which are bidirectional for current and unidirectional for voltage, and/or control units on the secondary side comprising switches which are unidirectional for current and bi-directional for voltage.

It is further preferred that the transformer is center-tapped, i.e. provided with a centrally arranged grounding connection. This is achieved by providing a galvanic isolation between the primary and the secondary side. This is especially important in consumer products in order to, isolate the end user from the mains.

According to another aspect of the invention, the invention relates to an audio product comprising an amplification device as discussed above.

The scope of the applicability of the present invention will become apparent from the detailed description given hereinafter. However, it should be understood that the detailed description and specific examples indicating preferred embodiments of the invention are given by way of illustration only, since various changes and modifications will be apparent to those skilled in the art from this detailed description without departing from the spirit and scope of the invention.

Figure 2:
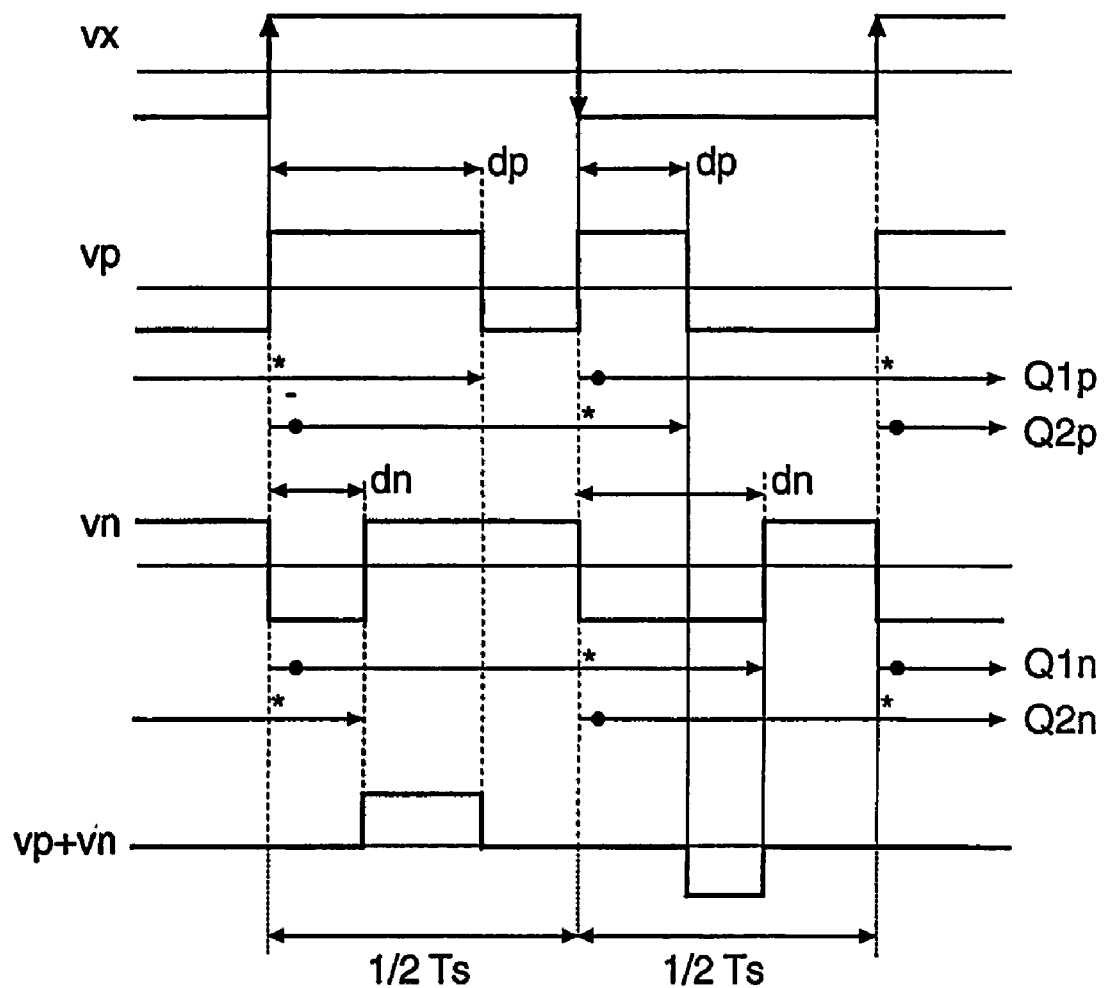

For exemplifying purposes, the invention will be described in more detail hereinbelow with reference to embodiments thereof which are illustrated in the attached drawings, wherein:

FIG. 1 is a schematic circuit diagram illustrating an amplification device according to an embodiment of the invention; and FIG. 2 is a timing diagram for the amplification device illustrated in FIG. 1.

The invention relates to an amplification device in which a switch mode power supply and a class D amplifier are combined with each other. A schematic layout of an embodiment of the amplifier according to the invention is shown in FIG. 1.

The amplification device comprises a magnetic component 1 forming a primary side S1 and a secondary side S2 of the device, said primary side being coupled to a voltage input of the device and said secondary side being coupled to a voltage output of the device. Said magnetic component is operative for both the switch mode power supply part and the switch mode amplifier part of the device in the preferred embodiment, the magnetic component is a transformer having primary and secondary windings 11, 12 inductively coupled together, thereby forming a primary and a secondary side S1, S2 of the device.

Furthermore, the amplification device comprises control units 2, 3 on each side of the transformer for controlling the current and/or the voltage, and preferably at least one energy storage element 4, such as a capacitor, on the primary side. Said energy storage element is preferably operative for both the switch mode power supply function and the switch mode amplifier function of the device, and could form part of said control unit 2 on the primary side. The energy storage element could e.g. be a dc voltage buffer. The control unit 2 on the primary side further preferably comprises two switching legs, most preferably forming a full-bridge inverter, e.g. operating at a constant switching frequency and a 50% duty cycle. The full-bridge inverter could comprise four identical switches 20, as illustrated in FIG. 1, with two switches on each leg. The primary side switches are preferably bi-directional for current and unidirectional for voltage. This could be realized by means of a field-effect transistor (FET), preferably a MOSFET, such as for instance in the parallel combination of a MOSFET 21 with a diode 22.

In the embodiment shown, the primary winding 11 of the transformer is arranged in the balanced center of the primary side control unit 2, i.e. between the switching legs. On the secondary side, the transformer preferably comprises two windings 12, the connection between the windings being grounded. In this manner, a center-tapped transformer is achieved, providing galvanic isolation between the input buffer and the load side.

The control unit 3 on the secondary side preferably comprises switches 30 that are unidirectional for current and bidirectional for voltage. These switches are preferably implemented by means of semiconductors, such as field-effect transistors (FET), preferably a MOSFET. A possible switch implementation is shown in FIG. 1, where MOSFETs 31 are connected in series with diodes 32. An insulated gate bipolar transistor (IGBT) with reverse blocking voltage capability can also be used for this purpose.

The switches on the secondary side are preferably identical, and could preferably be arranged in a bridge connection, with two parallel branches, each comprising two switches, and an interconnection 33 arranged between the switches of each branch. Accordingly, in this embodiment, two switches are arranged on the p-branch comprising the diode and MOSFET combinations Q1$p$, D1$p$ and Q2$p$, D2$p$, respectively. Similarly, the n-branch comprises the diode and MOSFET combinations Q1$n$, D1$n$ and Q2$n$, D2$n$, respectively. The interconnection provides the load output of the amplification device. Furthermore, inductances 34 could be arranged on each side of the load output center 35 of the interconnection 33. Said inductances functionally serve as low-pass filters.

In the above-discussed embodiment, the load current is found to be the difference between the currents through the filters 34, and proportional to the potential vo of the load output position 35 of the interconnection 33. The potential on each side of the interconnection is vp and vn. This potential could be written, in general, as:

$$vo = \tfrac{1}{2}*(vp+vn)$$

The timing for the switches is detailed in FIG. 2. For the sake of clarity, it is assumed in this diagram that the components are ideal.

The timing diagram illustrates the timing for the secondary switching legs, leg 1 and 2, with respect to the primary leg. After a positive transition of vx (from negative to positive voltage), transistors Q1$n$ and Q2$p$ are switched on. Furthermore, the positive flanks of vx should preferably be considered as the reference instants (designated with * in the diagram) for the conduction delays after which Q1$p$ and Q2$n$ are switched off. Conversely, the negative flanks of vx preferably mark the switch-on time of Q1$p$ and Q2$n$, and provide the reference time instants for the conduction delays of Q1$n$ and Q2$p$. It should be noticed that it is not necessary to switch on the transistors immediately after the flanks of vx, since the diodes in series with the switches will be first reverse polarized.

A closer look at the signals reveals that:

$$vo=(2*dp-1)*(V1/N) \quad vo=(dp-dn)*(V1/N)$$

$$\Rightarrow$$

$$vo=(1-2*dn)*(V1/N) \quad dp+dn=1$$

where dp and dn represent the duty cycle of Q1$p$&Q2$p$ and Q2$n$&Q1$n$, respectively.

In order to get a perfect reproduction of a reference signal, say Vref, it is only required that the pulse integrated average of vp—and consequently vn—is made equal to Vref within each cycle (or within a few cycles). For instance, a drop of the power supply level, V1, can be compensated for by widening the pulses—that is dp and dn—within the cycle interval, etc.

The amplification device as described above could easily be embodiment so as to be integrated unit comprising both the switch mode power supply part and the switch mode amplifier part, and the control units on the primary side and the secondary side could be controlled in order to achieve both the power supply function and the amplification function.

The amplification device according to the invention, and specifically as described above, provides a number of useful properties:

Blanking delays between a turnoff and the following turn-on in each switching leg on the primary side have no effect on the output voltage on the secondary side. Also,no disturbance is generated at the output by switch and diode recovery transients occurring on the primary side.

There is no necessity to insert blanking delays for the switches on the secondary side. As a consequence, one of the most severe sources of distortion in amplifiers, the so called dead zones, is eliminated from the converter.

Functional frequency multiplication is obtained at the load terminals. In the situation of FIG. 2, the output ripple frequency is doubled. Furthermore, the effective number of stepped voltage levels is augmented by one level, making filtering easy. This advantage is present especially in the device using two secondary switching legs, as discussed above.

All capacitive energy storage buffers are located at the high voltage side.

The transformer can be made small and no other magnetic storage components are required, except, of course, the small secondary inductors that provide low pass filtering.

To summarize, an amplification device has been disclosed providing a way of integrating a switch mode power supply and a class D amplifier (switch mode amplifier). This results in the usage of basically one magnetic component, one major energy storage element and switches that are controlled in such a way that both the power supply function and the amplification function are achieved. In this way a cheap, small and highly efficient current configuration is achieved. This amplification device is especially useful in audio products.

The invention has been described by means of preferred embodiments. However, many alternatives and modifications are feasible, as will be appreciated by someone skilled in the art For example, the control units could comprise types of switches other than the one discussed above. Furthermore, the magnetic component can only be shared by the two parts of the device, but it is also possible to share one or more additional components. In addition, other circuit solutions could be used, and specifically other components providing essentially the same functionality could be used to replace the components discussed with reference to the disclosed embodiment.

Such and other closely related alternatives and modifications of the invention must be considered to be within the scope of the invention as defined in the appended claims.

What is claimed is:

1. An amplification device comprising
a switch mode power supply part and
a switch mode amplifier part that includes:
   a magnetic component forming a primary and a secondary side of the device,
   the primary side being coupled to a voltage input of the device and
   the secondary side being coupled to a voltage output of the device,
the magnetic component being operative for both the switch mode power supply part and the switch mode amplifier part; and
at least one control unit on each side of the magnetic component for controlling current and/or voltage,
wherein
the at least one control unit on the primary side is configured to provide voltage transitions on the secondary side, and
the at least one control unit on the secondary side is configured to control the voltage output based on a time of occurrence of the voltage transitions.

2. The amplification device of claim 1, wherein
the switch mode power supply part and the switch mode amplifier part form an integrated unit.

3. The amplification device of claim 1, wherein
the magnetic component is a transformer having a primary winding on the primary side and a secondary winding on the secondary side, the windings being inductively coupled together.

4. The amplification device of claim 1, including
at least one energy storage element on the primary side that is operative for both the switch mode power supply part and the switch mode amplifier part.

5. The amplification device of claim 1, wherein
the control units are controllable to achieve both a power supply function and an amplification function.

6. The amplification device of claim 1, wherein
the at least one control unit on the primary side comprises switches that are bi-directional for current and unidirectional for voltage.

7. An amplification device comprising
a switch mode power supply part and
a switch mode amplifier part that includes:
   a magnetic component forming a primary and a secondary side of the device,
   the primary side being coupled to a voltage input of the device and
   the secondary side being coupled to a voltage output of the device,
the magnetic component being operative for both the switch mode power supply part and the switch mode amplifier part; and
at least one control unit on each side of the magnetic component for controlling current and/or voltage,
wherein
the control unit on the primary side forms a full-bridge inverter that operates at a constant switching frequency.

8. The amplification device of claim 1, wherein
the at least one control unit on the secondary side comprises switches that are unidirectional for current and bi-directional for voltage.

9. The amplification device of claim 1, wherein
the transformer is center-tapped, and is configured to provide a centrally arranged grounding connection.

10. An audio product comprising the amplification device of claim 1.

11. The amplification device of claim 7, wherein
the switch mode power supply part and the switch mode amplifier part form an integrated unit.

12. The amplification device of claim 7, wherein
the magnetic component is a transformer having a primary winding on the primary side and a secondary winding on the secondary side, the windings being inductively coupled together.

13. The amplification device of claim 7, including
at least one energy storage element on the primary side that is operative for both the switch mode power supply part and the switch mode amplifier part.

14. The amplification device of claim 7, wherein
the control units are controllable to achieve both a power supply function and an amplification function.

15. The amplification device of claim 7, wherein
the at least one control unit on the primary side comprises switches that are bi-directional for current and unidirectional for voltage.

16. The amplification device of claim 15, wherein
the at least one control unit on the secondary side comprises switches that are unidirectional for current and bi-directional for voltage.

17. The amplification device of claim 16, wherein
the transformer is center-tapped, and is configured to provide a centrally arranged grounding connection.

18. The amplification device of claim 7, wherein
the at least one control unit on the secondary side comprises switches that are unidirectional for current and bi-directional for voltage.

19. The amplification device of claim 7, wherein
the transformer is center-tapped, and is configured to provide a centrally arranged grounding connection.

20. An audio product comprising the amplification device of claim 7.

* * * * *